(12) United States Patent
Ueno

(10) Patent No.: US 12,277,899 B2
(45) Date of Patent: Apr. 15, 2025

(54) DISPLAY DEVICE THAT PREVENTS A DECREASE IN LUMINANCE RESULTING FROM DROP IN VOLTAGE

(71) Applicant: SHARP KABUSHIKI KAISHA, Sakai (JP)

(72) Inventor: Masafumi Ueno, Sakai (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 0 days.

(21) Appl. No.: 18/283,133

(22) PCT Filed: May 7, 2021

(86) PCT No.: PCT/JP2021/017430
§ 371 (c)(1),
(2) Date: Sep. 20, 2023

(87) PCT Pub. No.: WO2022/234629
PCT Pub. Date: Nov. 10, 2022

(65) Prior Publication Data
US 2024/0169902 A1 May 23, 2024

(51) Int. Cl.
*G09G 3/3208* (2016.01)
*G09G 3/20* (2006.01)

(52) U.S. Cl.
CPC ......... *G09G 3/3208* (2013.01); *G09G 3/2007* (2013.01); *G09G 2300/0452* (2013.01); *G09G 2320/0223* (2013.01); *G09G 2320/0285* (2013.01); *G09G 2330/02* (2013.01)

(58) Field of Classification Search
CPC ... G09G 2320/0223; G09G 2320/0285; G09G 2330/02; G09G 3/20; G09G 3/3225; H10K 59/35; H05B 33/02
See application file for complete search history.

(56) References Cited

U.S. PATENT DOCUMENTS

| | | | |
|---|---|---|---|
| 2005/0156635 A1* | 7/2005 | Yoneyama | G09G 3/32 327/108 |
| 2010/0020065 A1* | 1/2010 | Takasugi | G09G 3/3233 345/84 |
| 2010/0128064 A1* | 5/2010 | Taylor | G09G 3/3413 345/83 |

(Continued)

FOREIGN PATENT DOCUMENTS

| | | |
|---|---|---|
| JP | 2011-060482 A | 3/2011 |
| JP | 2011-060483 A | 3/2011 |
| WO | 2014/178282 A1 | 11/2014 |

*Primary Examiner* — Roberto W Flores
(74) *Attorney, Agent, or Firm* — ScienBiziP, P.C.

(57) ABSTRACT

A display device includes: a display panel including a plurality of pixels, the pixels including a first subpixel and a second subpixel each including a light-emitting layer emitting light of a first color, a third subpixel including a light-emitting layer emitting light of a second color, and a fourth subpixel including a light-emitting layer emitting light of a third color; a first power supply configured to supply a current to the first subpixel and the third subpixel; a second power supply configured to supply a current to the second subpixel and the fourth subpixel; and a signal processing circuit configured to receive an input signal for each pixel and generate a first signal corresponding to the first subpixel and a second signal corresponding to the second subpixel.

14 Claims, 13 Drawing Sheets

(56) References Cited

U.S. PATENT DOCUMENTS

| | | | |
|---|---|---|---|
| 2012/0069062 A1* | 3/2012 | Ishihara | G09G 3/3611 |
| | | | 345/690 |
| 2012/0112642 A1* | 5/2012 | Ikeda | H10K 59/84 |
| | | | 315/161 |
| 2016/0072069 A1 | 3/2016 | Takeuchi | |

* cited by examiner

DISPLAY DEVICE THAT PREVENTS A DECREASE IN LUMINANCE RESULTING FROM DROP IN VOLTAGE

TECHNICAL FIELD

The disclosure relates to a display device.

BACKGROUND ART

In the related art, TFT liquid crystal driven by an active matrix method in which pixels are controlled using electrodes disposed in a lattice pattern has been widely used. An organic light-emitting diode (OLED) display which includes a light-emitting element and does not need a backlight is known. PTL 1 discloses an organic electroluminescent element in which each emission color can be independently controlled by providing an intermediate electrode having excellent light transmittance.

CITATION LIST

Patent Literature

PTL 1: WO 2014/178282A1

SUMMARY

Technical Problem

However, in the related art as described above, as a current flowing through the display panel increases in order to output high luminance in a display panel, the influence of an IR drop, which is a kind of voltage drop, increases, making a decrease in luminance likely. When the amounts of currents supplied to light-emitting layers of respective colors are different from each other, there is a possibility of causing color shift.

An aspect of the disclosure is made in view of the above-described problems, and an object thereof is to curb a decrease in luminance and occurrence of color shift due to an IR drop in a display panel.

Solution to Problem

In order to solve the above-described problems, a display device according to an aspect of the disclosure includes a display panel including a plurality of pixels, the pixels including a first subpixel and a second subpixel each including a light-emitting layer emitting light of a first color, a third subpixel including a light-emitting layer emitting light of a second color, and a fourth subpixel including a light-emitting layer emitting light of a third color, a first power supply configured to supply a current to the first subpixel and the third subpixel, a second power supply configured to supply a current to the second subpixel and the fourth subpixel, and a signal processing circuit configured to receive an input signal for each pixel and generate a first signal corresponding to the first subpixel and a second signal corresponding to the second subpixel.

Advantageous Effects of Disclosure

According to an aspect of the disclosure, it is possible to curb a decrease in luminance and occurrence of color shift due to an IR drop in a display panel.

DESCRIPTION OF EMBODIMENTS

First Embodiment

Hereinafter, an embodiment of the disclosure will be described in detail. In the present embodiment, description will be given of a display device capable of curbing a decrease in luminance and occurrence of color shift due to an IR drop by providing a plurality of subpixels of a specific color in a pixel.

1. Configuration Example of Display Device

Figure 1:
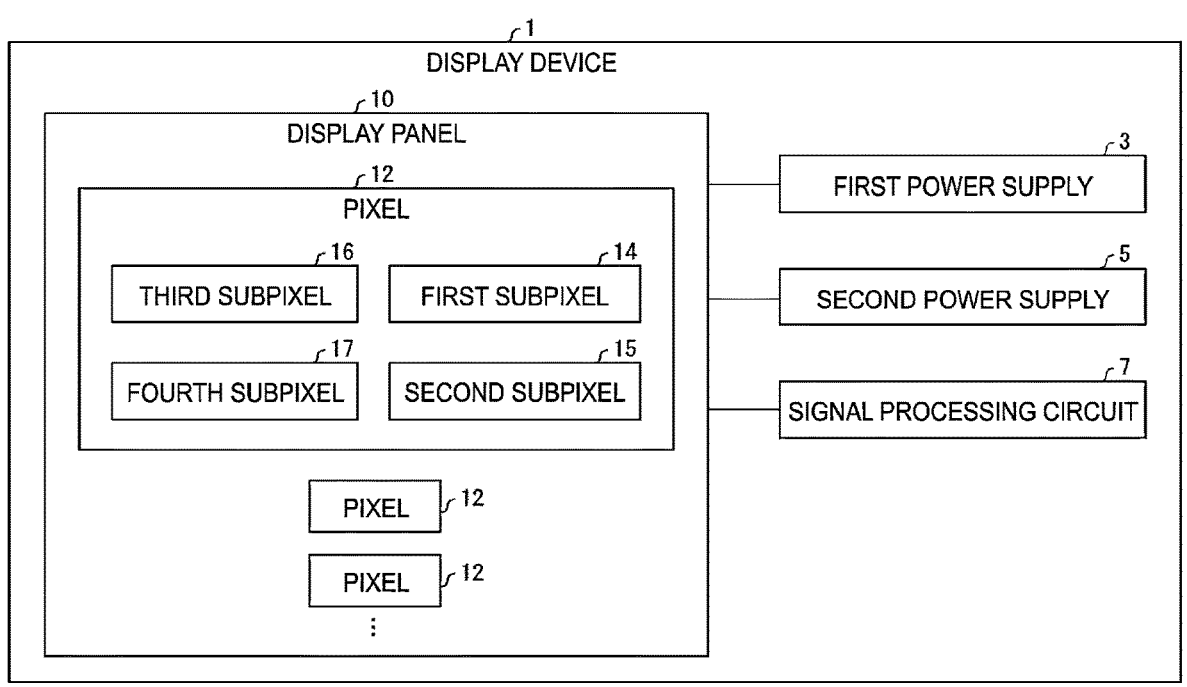
FIG. 1 is a functional block diagram of a display device according to a first embodiment.

A display device according to the present embodiment will be described. FIG. 1 is a functional block diagram of a display device 1 according to the present embodiment. The display device 1 is a display that displays a screen corresponding to an input image signal, and includes a display panel 10, a first power supply 3, a second power supply 5, and a signal processing circuit 7.

Figure 2:
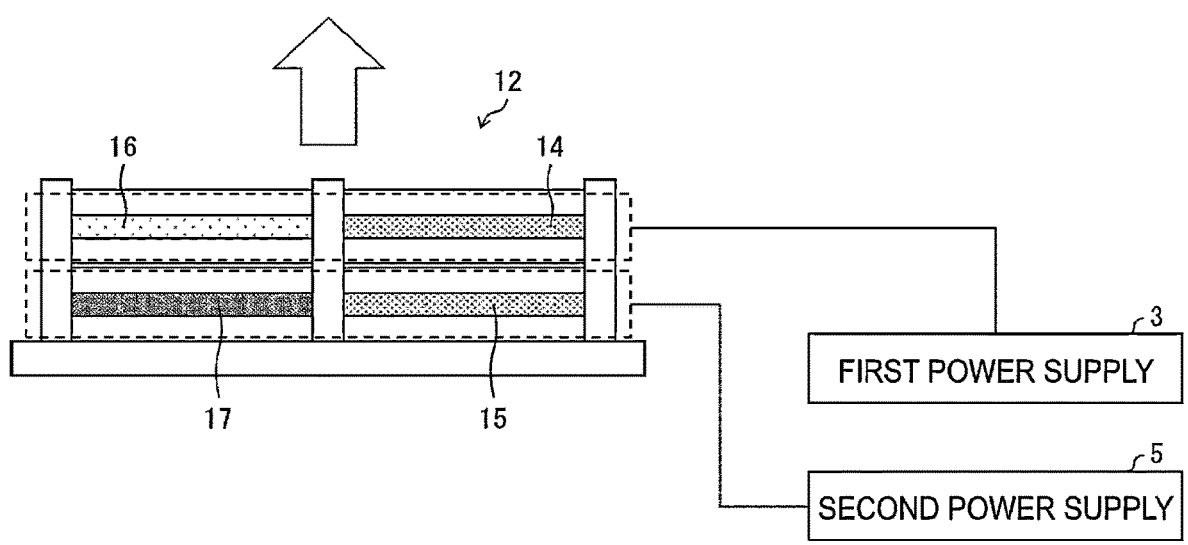
FIG. 2 is a conceptual diagram illustrating a pixel mounted on a substrate of a display panel.

The display panel 10 displays a moving image, text, or the like on the screen based on a signal supplied from the signal processing circuit 7. FIG. 2 is a conceptual diagram illustrating a pixel 12 mounted on a substrate of the display panel 10. Although a single pixel 12 is illustrated in FIG. 2, the display panel 10 includes a plurality of pixels 12 disposed in a matrix. The pixels 12 are controlled by a source signal supplied via a source driver on the substrate which is not illustrated in the drawing, and a gate signal supplied via a gate driver on the substrate.

As illustrated in FIGS. 1 and 2, the pixel 12 includes a first subpixel 14, a second subpixel 15, a third subpixel 16, and a fourth subpixel 17. Each of the first subpixel 14 and the second subpixel 15 includes a light-emitting layer that emits light of a blue color which is a first color. That is, the pixel 12 emits blue light having a target grayscale value by dividing the light into a plurality of subpixels. The third subpixel 16 includes a light-emitting layer that emits light of a green color which is a second color, and the fourth subpixel 17 includes a light-emitting layer that emits light of a red color which is a third color. Here, the first color corresponds to a primary color with the largest power consumption in the subpixels among primary colors of light emitted by the subpixels.

In the following description, member numbers of pixels and subpixels included in the display panel 10 may be omitted for simplification. In the following description, the first subpixel may be referred to as a B1 pixel, and the second subpixel may be referred to as a B2 subpixel. The third subpixel may be referred to as a G pixel, and the fourth subpixel may be referred to as an R pixel. When the B1 pixel and the B2 pixel are not particularly distinguished from each other, one or both of them may be simply referred to as a B pixel. A combination of each subpixel and the color of emitted light is not limited to the above-described combination.

The first power supply 3 supplies a current to the B1 pixel and the G pixel. In other words, the B1 pixel and the G pixel emit light by the current supplied from the first power supply 3. The second power supply 5 supplies a current to the B2 and R pixels. In other words, the B2 pixel and the R pixel emit light by the current supplied from the second power supply 5.

In the example of FIG. 2, the B1 pixel and the G pixel are disposed in a planar shape in a first layer (upper layer) of the display panel 10, and the B2 pixels and the R pixels are disposed in a planar shape in a second layer (lower layer) of the display panel 10. An arrow illustrated above the pixel 12 in FIG. 2 indicates a forward direction of the display panel 10, and the same applies to the subsequent drawings. The first layer of the display panel 10 is disposed closer to the front surface of the display panel 10 than the second layer, and the first layer and the second layer are disposed overlapping each other when viewed from the front of the display panel 10. The B1 pixel is disposed overlapping the B2 pixel, and the G pixel is disposed overlapping the R pixel. Thereby, in addition to light emitted from the B1 pixel, light emitted from the B2 pixel is emitted from the surface of the B1 pixel. In addition to light emitted from the G pixel, light emitted from the R pixel is emitted from the surface of the G pixel.

The signal processing circuit 7 generates a first signal corresponding to the B1 pixel (first subpixel), a second signal corresponding to the B2 pixel (second subpixel), a third signal corresponding to the G pixel (third subpixel), and a fourth signal corresponding to the R pixel (fourth subpixel) in response to an input of an image signal from outside of the display device 1, or the like. Here, the first to fourth signals are signals that respectively specify grayscale values at which the first to fourth subpixels emit light. In another aspect, the first to fourth signals specify the amounts of current supplied to the first to fourth subpixels, respectively. The signal processing circuit 7 controls light emission of each pixel by supplying each generated signal to a driver of the display panel 10. The signal processing circuit 7 may be configured to be included in the display panel 10.

Figure 3:
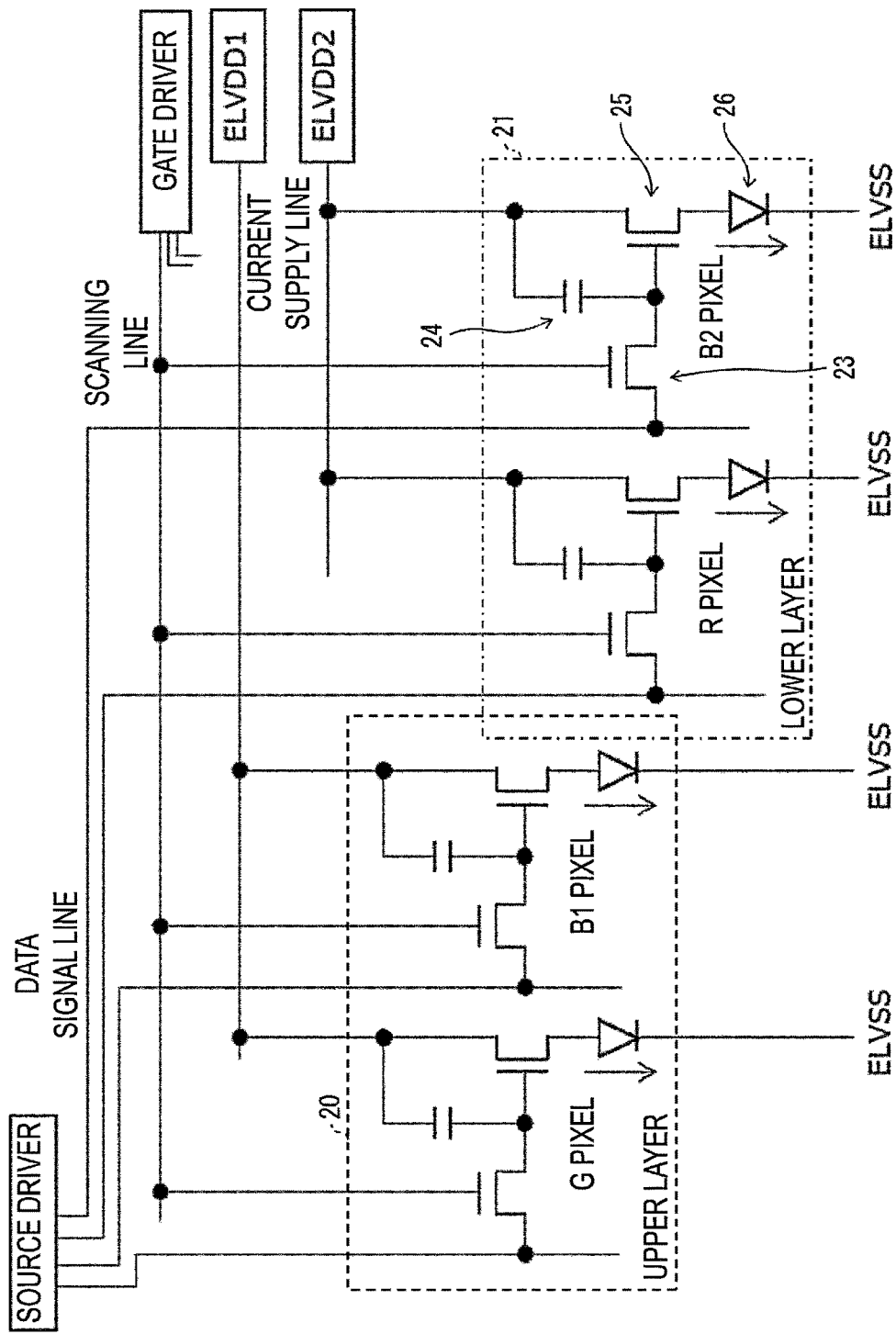
FIG. 3 is an example of a circuit diagram of a substrate included in the display panel.

FIG. 3 is an example of a circuit diagram of a substrate included in the display panel 10. In FIG. 3, a pixel circuit 20 corresponds to a first layer having a B1 pixel and a G pixel, and a pixel circuit 21 corresponds to a second layer having a B2 pixel and an R pixel.

A plurality of subpixels of each color are disposed between ELVDD (high level power supply voltage) and ELVSS (low level power supply voltage). ELVDD1 in FIG. 3 corresponds to the first power supply 3, and ELVDD2 corresponds to the second power supply 5. Each subpixel includes a selection thin film transistor (TFT) 23 connected to a data signal line and a scanning line, a holding capacitor 24, a drive TFT 25 connected to a current supply line, and a diode 26. A light-emitting diode 26 of the first subpixel includes a light-emitting layer that emits blue light, a light-emitting diode 26 of the second subpixel includes a light-emitting layer that emits blue light, a light-emitting diode 26 of the third subpixel includes a light-emitting layer that emits green light, and a light-emitting diode 26 of the fourth subpixel includes a light-emitting layer that emits red light. Unlike a power supply, a data signal line connected to the source driver and a scanning line connected to the gate driver may be connected in common to the first layer and the second layer.

The substrate included in the display panel 10 writes a data signal (voltage) to each pixel from the source driver in synchronization with a signal from the gate driver, and maintains the supply of power in a period of one frame by controlling the amount of current from ELVDD1 and ELVDD2 by the drive TFT.

Figure 4:
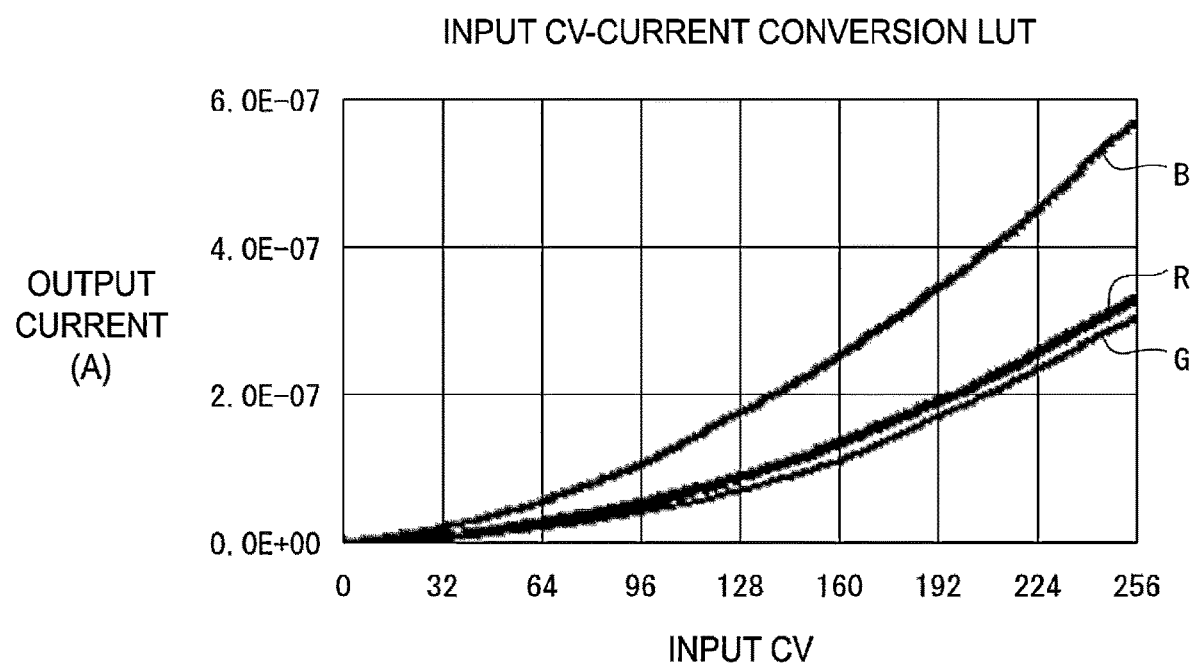
FIG. 4 is a graph showing an example of a relationship between an input grayscale value of each color and an output current corresponding to the input grayscale value in an existing display panel.

Hereinafter, current characteristics and the like of the display panel, which are prerequisites for processing in which the signal processing circuit 7 generates each signal, will be described using an existing display panel as an example. FIG. 4 is a graph showing an example of a relationship between an input grayscale value of each color and an output current corresponding to the input grayscale value in an existing display panel. In the graph of FIG. 4, the horizontal axis represents an input grayscale value of 256 levels corresponding to an image signal, and the vertical axis represents the value of an output current which is the amount of current supplied to a single subpixel. The value of the output current can be determined by a circuit equivalent to the signal processing circuit 7 with reference to a Look Up Table (LUT) stored in the circuit itself. Here, the LUT corresponding to the luminance setting of the display panel is referred to. This also applies to LUTs to be described below. Normally, power consumption of a light-emitting layer of a blue color is larger than power consumption of light-emitting layers of other colors. In the example of FIG. 4, at the same input grayscale value, a current required for a subpixel of a blue color is approximately 1.8 times a current required for subpixels of other colors. This means that, even when the same output current is supplied to the subpixels, when a target is the subpixel of a blue color, the subpixel of the blue color emits light only at a grayscale value lower than those of the subpixels of the other colors.

There is a concern that a large current required for the subpixel of a blue color may cause an increase in power consumption, a temperature rise, deterioration over time, or the like in the entire display panel. An increase in the power consumption of the display panel tends to cause a decrease in luminance and a variation in luminance of the screen due to an IR drop.

Figure 5:
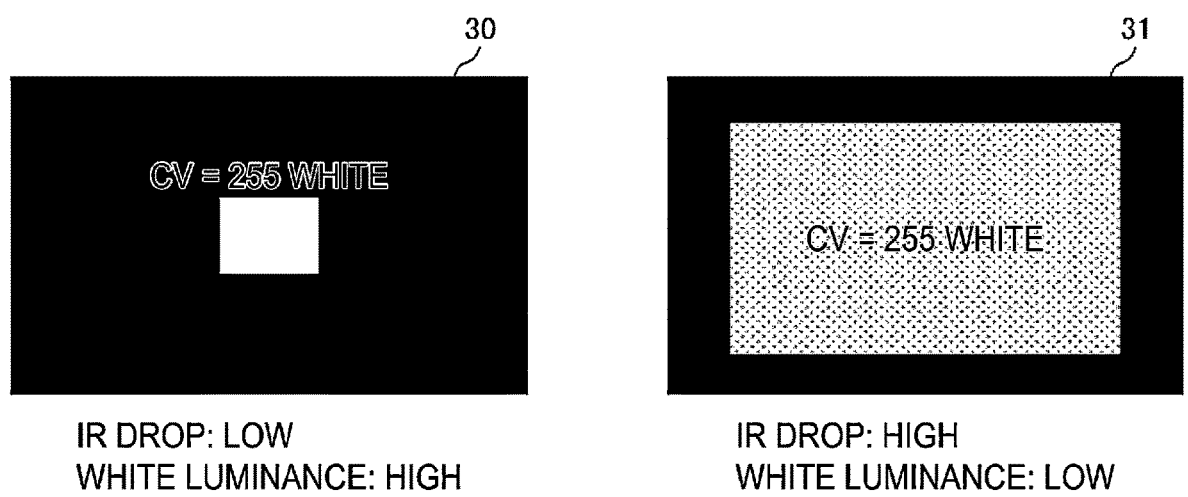
FIG. 5 is a diagram illustrating an example of a display screen of an existing display panel.

FIG. 5 is a diagram illustrating an example of a display screen of an existing display panel. In FIG. 5, "255" indicates that an input grayscale value is a maximum of 255 for each primary color, that is, that a white color with high luminance is displayed. In addition, the area of a region in which a white color is displayed and the power consumption are larger in a screen 31 than in a screen 30, and the amount of IR drop generated is larger in the screen 31 than in the screen 30.

In this case, as illustrated in FIG. 5, even when grayscale values are the same, an output luminance indicating the brightness of the screen 31 may be lower than that of the screen 30 in a white region.

Figure 6:
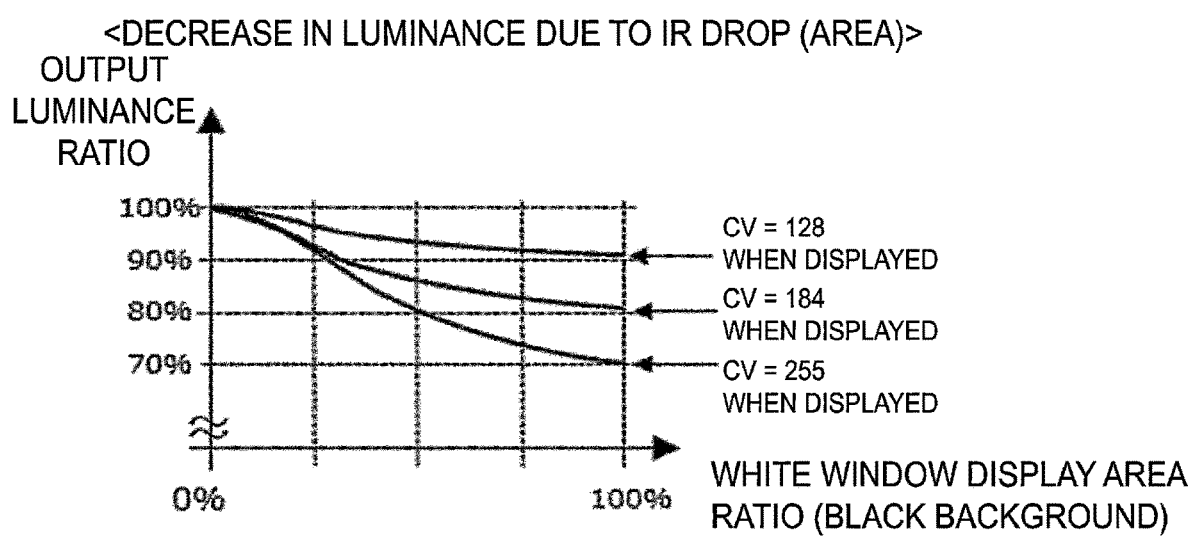
FIG. 6 is a graph showing an example of a decrease in an output luminance due to an IR drop.

FIG. 6 is a graph showing an example of a decrease in an output luminance due to an IR drop. In the graph of FIG. 6, the horizontal axis represents a ratio of a region in which a white color is displayed with respect to an entire screen. In a region in which a white color is not displayed, a black background having a grayscale value of 0 for each primary color is displayed as in the screen of FIG. 5. The vertical axis represents an output luminance ratio corresponding to an input grayscale value. For example, in a graph of CV (input grayscale value)=128, when a ratio of a region in which a white color is displayed is 100%, an output luminance ratio is approximately 90%, which indicates that a screen is displayed with an output luminance of 90% of a white color having a grayscale value of 128. In a graph of CV=255, when a ratio of a region in which a white color is displayed is 50%, an output luminance ratio is approximately 80%, which indicates that a screen is displayed with an output luminance of 80% of a white color having a grayscale value of 255. As illustrated in FIG. 6, as a grayscale value of a white color increases and as the area of a region in which a white color is displayed increases, the influence of an IR drop increases, and an output luminance ratio decreases.

Figure 7:
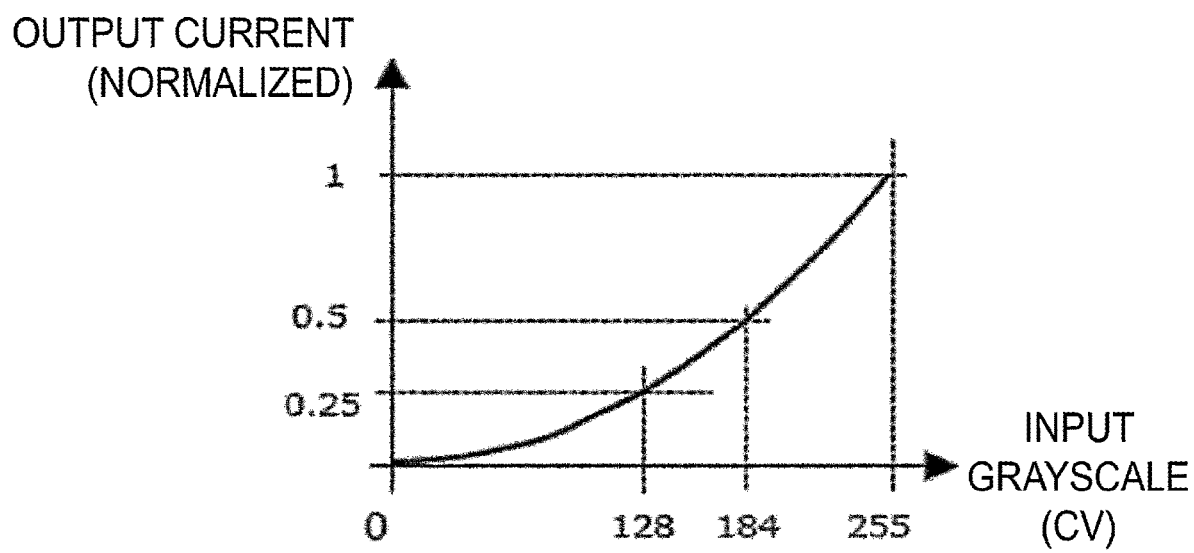
FIG. 7 is a graph showing an example of a relationship between an input grayscale value and an output current.

FIG. 7 is a graph showing an example of a relationship between an input grayscale value and an output current in a display panel similar to that illustrated in FIG. 6. In the graph of FIG. 7, the horizontal axis represents an input grayscale value of a white color of 256 levels. The vertical axis represents a normalized output current value when an output current value corresponding to a white color having a maximum input grayscale value of 255 is set to 1. A gamma value of a display panel corresponding to FIG. 7 is adjusted to approximately 2.2. When an input grayscale value is 128, an output current and an output luminance are approximately ¼ of those when an input grayscale value is 255. As illustrated in FIGS. 6 and 7, since the output current value in a case where the white color having an input grayscale value of 128 is displayed in a region of 100% of the screen and the output current value in a case where the white color having an input grayscale value of 255 is displayed in a region of 25% of the screen are approximately the same, output luminance values are also the same degree of approximately 90%.

The degree of decrease in an output luminance due to an IR drop when an arbitrary display image is displayed on the display panel can be estimated by the sum of products of the input grayscale value (or the output current value) and the display area (or the number of pixels). However, since a current required for each of the colors of the subpixel is different, the influence of the IR drop may also be different for each color. As the power consumption of the entire display panel increases, the influence of the IR drop increases, and the degree of decrease in the output luminance also increases.

Current characteristics and the like of the display panel 10 have been described above by using the existing display panel as an example. Subsequently, how the signal processing circuit 7 distributes output currents to be supplied to the B1 pixel and the B2 pixel and generates a first signal and a second signal in the display panel 10 according to the disclosure will be described.

Figure 8:
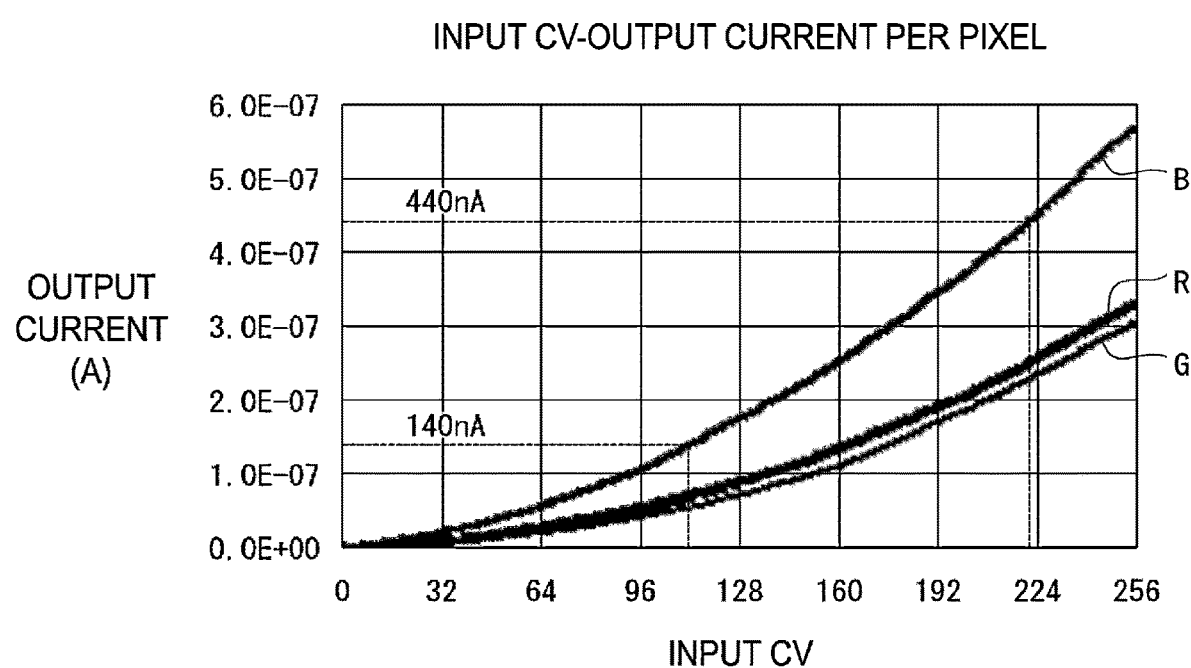
FIG. 8 is a graph showing an example of a relationship between an input grayscale value of each color and an output current corresponding to the input grayscale value.

FIG. 8 is a graph corresponding to FIG. 4 and illustrates an example of the amounts of currents distributed to the B1 pixel and the B2 pixel.

For the R pixel and the G pixel, since each pixel includes a single subpixel, the signal processing circuit 7 sets an output current value corresponding to an input grayscale value as is. On the other hand, for the B pixel, the signal processing circuit 7 adjusts output current values supplied to the B1 pixel and the B2 pixel in accordance with output current values supplied to the R pixel and the G pixel.

In another aspect, the signal processing circuit 7 may generate a first signal and a second signal in accordance with the amount of current to be supplied by the first power supply 3 to the G pixel included in the plurality of pixels and the amount of current to be supplied by the second power supply 5 to the R pixel included in the plurality of pixels. For example, when an arbitrary color is displayed on the entire screen, the signal processing circuit 7 may generate a first signal and a second signal such that the amount of current supplied to the first layer and the amount of current supplied to the second layer are equal to each other.

For example, when a cyan color (R, G, B: 0, 255, 255) is displayed on a screen, a current is consumed in the G pixel of the first layer and is not consumed in the R pixel of the second layer. In this case, the signal processing circuit 7 sets more current to be supplied to the B2 pixel of the second layer than to the B1 pixel of the first layer.

Assuming that an output current corresponding to an input grayscale value of 255 of a blue color is 580 nA, the signal processing circuit 7 sets a total amount of currents supplied to the B1 pixel and the B2 pixel to be 580 nA. Here, the amounts of currents supplied to the B1 pixel and the B2 pixel by the signal processing circuit 7 may be different from each other. In another aspect, the signal processing circuit 7 may generate a first signal and a second signal such that a grayscale value at which the B1 pixel emits light (the grayscale value of the first signal) and a grayscale value at which the B2 pixel emits light (the grayscale value of the second signal) are different from each other. In other words, the signal processing circuit 7 may set the first signal and the second signal to have different values.

The signal processing circuit 7 sets the amount of current supplied to the B1 pixel to 140 nA, for example, by the following equation. In the following equation, 300 (nA) is an output current value corresponding to an input grayscale value of 255 of a green color. As illustrated in FIG. 8, 140 nA being the amount of current supplied to the B1 pixel corresponds to an input grayscale value of 112 of a blue color.

$$B1: (580-300)/2=140$$

The signal processing circuit 7 sets the amount of current supplied to the B2 pixel to 440 nA, for example, by the following equation. As illustrated in FIG. 8, the amount of current corresponds to an input grayscale value of 222 of a blue color. Thus, it is desirable that the B1 pixel and the B2 pixel be capable of outputting at least a certain degree of high grayscale.

$$B2: 300+(580-300)/2=440$$

Thereby, for a single pixel, the amount of current supplied to the first layer and the amount of current supplied to the second layer are both 440 nA.

As an example of another color, when a magenta color (R, G, B: 255, 0, 255) is displayed on the screen, the signal processing circuit 7 sets the amounts of currents supplied to the B1 pixel and the B2 pixel to 450 nA and 130 nA, respectively, for example, by the following equations. In the following equations, 320 (nA) is an output current value corresponding to an input grayscale value of 255 of a red color.

$$B1: 320+(580-320)/2=450$$

$$B2: (580-320)/2=130$$

In this case, the amount of current supplied to the first layer and the amount of current supplied to the second layer for a single pixel are both 450 nA.

In addition, when a white color (R, G, B: 255, 255, 255) is displayed on the screen, the signal processing circuit 7 sets the amounts of currents supplied to the B1 pixel and the B2 pixel to 300 nA and 280 nA, respectively, for example, by the following equations.

$$B1: 320+(580-320-300)/2=300$$

$$B2: 300+(580-320-300)/2=280$$

In this case, the amount of current supplied to the first layer and the amount of current supplied to the second layer for a single pixel are both 600 nA.

2. Example of Processing of Display Device

Figure 9:
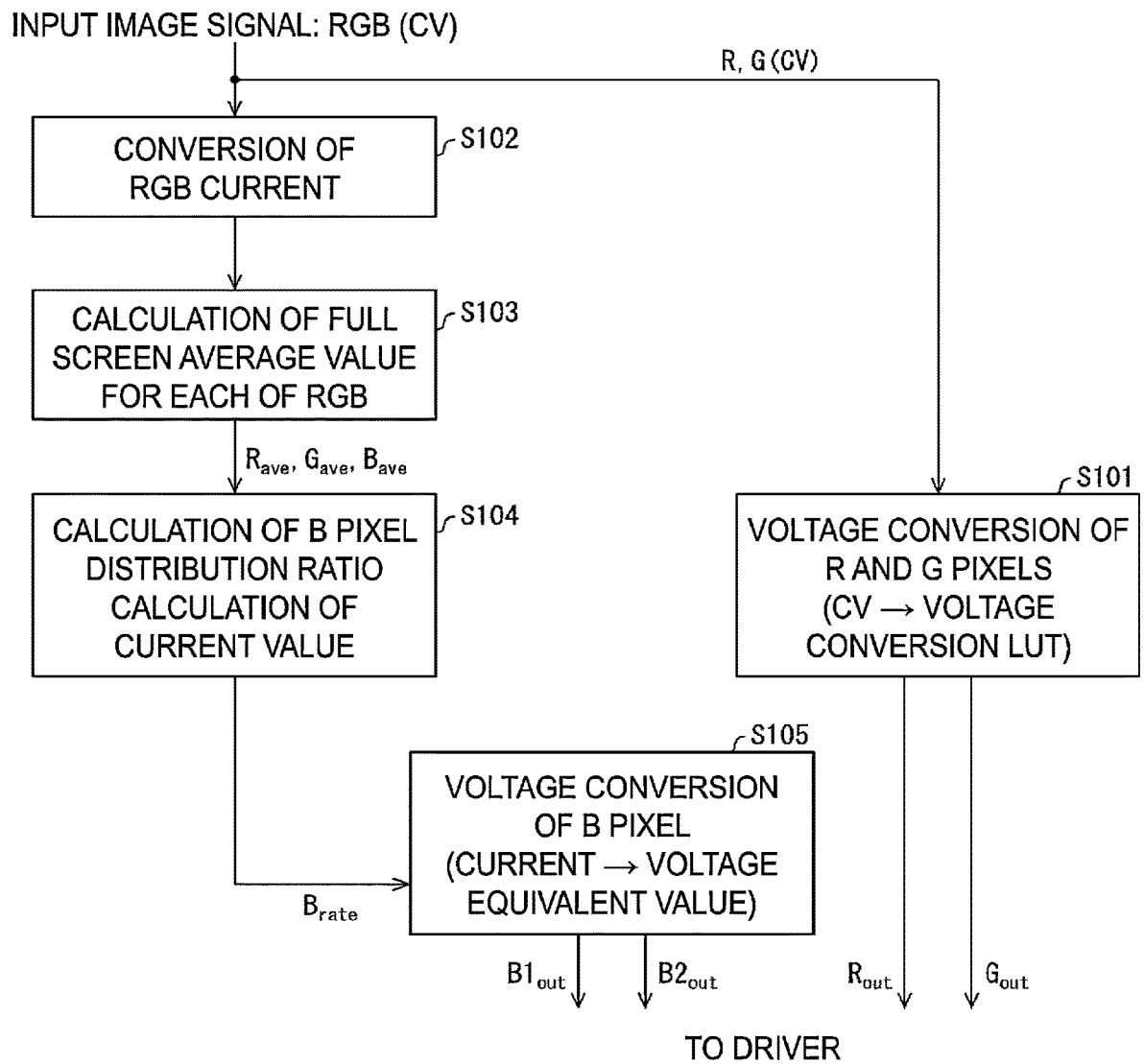
FIG. 9 is a flowchart illustrating an example of a processing procedure of a signal processing circuit.

In the above description, an example of processing of the signal processing circuit 7, for example, in a case where an arbitrary color is displayed on the entire screen has been described. However, for example, when an image including various colors such as a natural image is displayed on the screen, it is preferable to perform more strict processing. Consequently, hereinafter, an example of a processing procedure in which the signal processing circuit 7 included in the display device 1 according to the disclosure generates first to fourth signals in response to an input of an image signal will be described. FIG. 9 is a flowchart illustrating an example of a processing procedure of the signal processing circuit 7.

In step S101, the signal processing circuit 7 generates the third signal and the fourth signal. For example, the signal processing circuit 7 generates the third signal and the fourth signal that include voltage values that correspond to input image signals and are applied to pixel electrodes of G pixels and R pixels with reference to an LUT indicating a relationship between input grayscale values of respective colors and voltages applied to pixel electrodes of corresponding subpixels. The processing of step S101 may be performed in parallel with processing of step S102 and the subsequent steps, or may be performed subsequently to processing of step S104.

In step S102, the signal processing circuit 7 calculates output current values that correspond to the input image signals and are to be supplied to the R, G, and B pixels included in the display panel 10 with reference to, for example, the LUT corresponding to FIG. 4. The output current values calculated in step S102 may be normalized values as described above with reference to FIG. 7.

In step S103, the signal processing circuit 7 calculates an average of output current values to be supplied to the subpixels of the entire screen for each of the colors of the subpixels.

The signal processing circuit 7 calculates $R_{Ave}$ which is an average of current values to be supplied to the R pixels of the entire screen, $G_{Ave}$ which is an average of current values to be supplied to the G pixels of the entire screen, and $B_{Ave}$ which is an average of current values to be supplied to the B pixels of the entire screen. $R_{Ave}$ is an example of a third average value in the disclosure, and $G_{Ave}$ is an example of a second average value in the disclosure. In addition, $B_{Ave}$ is an example of a first average value in the disclosure.

It is not essential to strictly use the output current values supplied to all of the subpixels, and for example, an average value of the amounts of currents for the entire screen may be calculated by calculating values averaged in units of horizontal lines for all lines.

In step S104, the signal processing circuit 7 calculates each of the amounts of currents supplied to the B1 pixels and the B2 pixels using, for example, the following equations. In the following equations, $B_{in}$ represents the amount of current supplied to the B pixel in a target pixel. $B1_{rate}$ indicates a distribution ratio of the amount of current supplied to the B1 pixel with respect to $B_{in}$. $B1_{out}$ indicates the amount of current supplied to the B1 pixel in the target pixel, and $B2_{out}$ indicates the amount of current supplied to the B2 pixel in the target pixel.

$$B1_{rate}=(R_{Ave}-G_{Ave})/2*B_{Ave}+0.5(0\le B1_{rate}\le 1)$$

$$B1_{out}=B_{in}*B1_{rate}$$

$$B2_{out}=B_{in}-B1_{out}$$

When $B1_{rate}$ is a value less than 0, the signal processing circuit 7 clips the value to 0, and when $B1_{rate}$ is a value exceeding 1, the signal processing circuit 7 clips the value to 1. Here, when the value of $B1_{rate}$ is less than 0, it means that the current consumption of the first layer exceeds the current consumption of the second layer even when only the B2 pixel among the B pixels is caused to emit light and the B1 pixel is not caused to emit light. When the value of $B1_{rate}$ exceeds 1, it means that the current consumption of the second layer exceeds the current consumption of the first layer even when only the B1 pixel among the B pixels is caused to emit light and the B2 pixel is not caused to emit light. In this manner, depending on an image signal, there may be a case where currents supplied to the first layer and the second layer cannot be equalized in some pixels.

For example, when the above-described equations are calculated for a case where a magenta color (R, G, B: 255, 0, 255) is displayed on the screen, values of $B1_{rate}$ and the like are as follows. Since a grayscale value of a blue color is 255 in the entire screen, $B_{in}=B_{Ave}=580$ (nA) when the above-described example is applied.

$$B1_{rate}=(320-0)/(2*580)+0.5=0.776$$

$$B1_{out}=580*0.776=450 \text{ (nA)}$$

$$B2_{out}=580-450=130 \text{ (nA)}$$

When the above-described equations are applied to a case where a white color (R, G, B: 255, 255, 255) is displayed on the screen, values of $B1_{rate}$ and the like are as follows. Since a grayscale value of a green color is 255 in the entire screen, $G_{Ave}=300$ (nA) when the above-described example is applied.

$$B1_{rate}=(320-300)/(2*580)+0.5=0.517$$

$$B1_{out}=580*0.517=300 \text{ (nA)}$$

$$B2_{out}=580-300=280 \text{ (nA)}$$

In step S105, the signal processing circuit 7 generates a first signal and a second signal that include voltage values that correspond to current values supplied to the B1 pixels and the B2 pixels and are applied to pixel electrodes of the B1 pixels and the B2 pixels, the voltage values corresponding to input image signals. In the processing of step S105, the signal processing circuit 7 may calculate input grayscale values corresponding to the current values with reference to, for example, the LUT corresponding to FIG. 8, and then calculate the above-described voltage values with reference to an LUT indicating a relationship between input grayscale values of respective colors and voltage values. Alternatively, the signal processing circuit 7 may refer to a single LUT indicating a relationship between current values and voltage values.

The first to fourth signals generated by the signal processing circuit 7 are supplied to the driver of the display panel 10 and used for control of causing each pixel to emit light.

That is, the signal processing circuit 7 in this example executes the following processing in steps S102 to S105.

(1) Reference is made to LUTs indicating a relationship between input signals and the amounts of currents to be supplied to subpixels of a first color, a relationship between input signals and the amounts of currents to be supplied to subpixels of a second color, and a relationship between input signals and the amounts of currents to be supplied to subpixels of a third color. Thereby, a first average value which is an average of a plurality of pixels of current values to be supplied to the subpixels of the first color, a second average value which is an average of a plurality of pixels of current values to be supplied to the subpixels of the second color, and a third average value which is an average of a plurality of pixels of current values to be supplied to the subpixels of the third color are calculated.

(2) A first signal and a second signal are generated based on the amounts of currents to be supplied to the subpixels of the first color and the first to third average values.

In the method described above in this example, since an average value $R_{Ave}$ and the like of the amounts of currents supplied to the subpixels of the entire screen are calculated for each of the colors of the subpixels, it is necessary to store data for one frame and perform calculation for each pixel. For this reason, a delay of at least one frame occurs in the display panel 10. However, the signal processing circuit 7 may use an average value of the amounts of currents supplied to the subpixels of the entire screen in the past frames on the assumption that there is no large image change in the preceding and succeeding frames. In other words, the signal processing circuit 7 may generate a first signal and a second signal for a frame after a certain frame of an input signal based on a first average value, a second average value, and a third average value relating to the certain frame.

The signal processing circuit 7 is not limited to a configuration in which an average value $R_{Ave}$ and the like of the amounts of currents supplied to the subpixels are obtained for the entire screen, and then a distribution ratio of the amount of current supplied to the B1 pixel is calculated. For example, the signal processing circuit 7 may calculate the distribution ratio by calculating an average value in a unit of one to several lines, or may calculate the amounts of currents supplied to the B1 pixel and the B2 pixel in units of pixels.

However, since there may be a difference in the amount of current supplied to the first layer and the second layer in the entire screen of the display panel 10, it is desirable to calculate the distribution ratio after obtaining $R_{Ave}$ and the like for the entire screen if possible.

That is, when the amount of current to be supplied by the second power supply 5 to the R pixel included in the plurality of pixels is larger than the amount of current to be supplied by the first power supply 3 to the G pixel included in the plurality of pixels, it is desirable that the signal processing circuit 7 generate a first signal and a second signal such that the amount of current supplied to the B2 pixel included in the plurality of pixels is smaller than the amount of current supplied to the B1 pixel included in the plurality of pixels. In this case, the signal processing circuit 7 may set the grayscale value of the second signal to be equal to or less than the grayscale value of the first signal.

When the amount of current to be supplied by the second power supply 5 to the R pixel included in the plurality of pixels is smaller than the amount of current to be supplied by the first power supply 3 to the G pixel included in the plurality of pixels, it is desirable that the signal processing circuit 7 generate a first signal and a second signal such that the amount of current supplied to the B2 pixel included in the plurality of pixels is larger than the amount of current supplied to the B1 pixel included in the plurality of pixels. In this case, the signal processing circuit 7 may set the grayscale value of the second signal to be equal to or larger than the grayscale value of the first signal.

When the distribution ratio is strictly updated for each frame, there is a possibility that an output luminance in the B pixel may vary. Thus, for example, a configuration may be adopted in which upper and lower limits may be set for a variation amount of a distribution ratio in the preceding and succeeding frames, and the distribution ratio may be smoothly varied in a time direction. That is, by using a ratio of the amount of current supplied to the B1 pixel to the amounts of currents supplied to the B pixels as a distribution ratio, the signal processing circuit 7 may limit the amount of change from a distribution ratio in a certain frame of the input signal to a distribution ratio in a frame subsequent to the certain frame to a predetermined amount or less.

According to the configuration of the present embodiment, it is possible to curb the occurrence of an IR drop by providing a plurality of subpixels corresponding to a first color in each pixel and supplying a current from separate power sources to the subpixels. It is possible to curb the occurrence of color shift by adjusting a distribution ratio of a current supplied to the subpixels.

Modification Example 1 of First Embodiment

Next, Modification Example 1 of the first embodiment will be described. For convenience of description, members having the same functions as those of the members described in the above-described embodiment will be denoted by the same reference numerals and signs, and the repeated description thereof will not be repeated. The same applies to the subsequent modification examples and embodiments.

Figure 10:
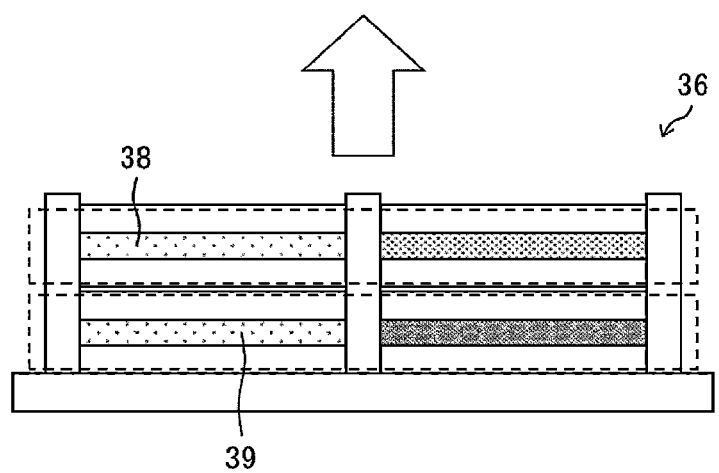
FIG. 10 is a conceptual diagram illustrating a pixel mounted on a substrate of a display panel according to Modification Example 1 of the first embodiment.
Figure 10:
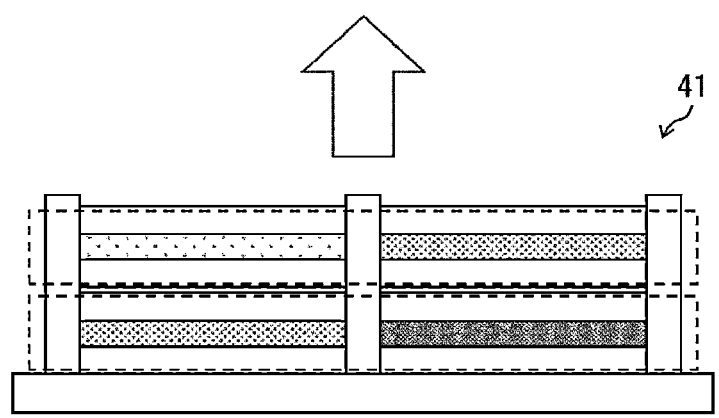

In the first embodiment, description has been given of a configuration in which a B1 pixel and a B2 pixel are disposed overlapping each other and a G pixel and an R pixel are disposed overlapping each other, but the configuration is not limited thereto. FIG. 10 is a conceptual diagram illustrating a pixel mounted on a substrate of a display panel 10 according to the present modification example.

When a current required for the G pixel is larger than those for the B pixel and the R pixel, a configuration may be adopted in which the G pixel is realized as a plurality of subpixels 38 and 39 as shown in a pixel 36. In the case of the above-described configuration, a green color corresponds to a first color in the disclosure.

The subpixels of the same color do not necessarily overlap each other, and a configuration may be adopted in which the subpixels of the first color overlap different colors as shown in a pixel 41.

When a quantum dot light-emitting diode (QLED) is used in a light-emitting layer, the influence of excitation light emission due to output light from other subpixels is considered. For example, when excitation light emission occurs in a light-emitting layer of the R pixel due to output light from the B pixel, it is desirable that the B pixel be disposed in a first layer and the R pixel be disposed in a second layer.

Modification Example 2 of First Embodiment

Figure 11:
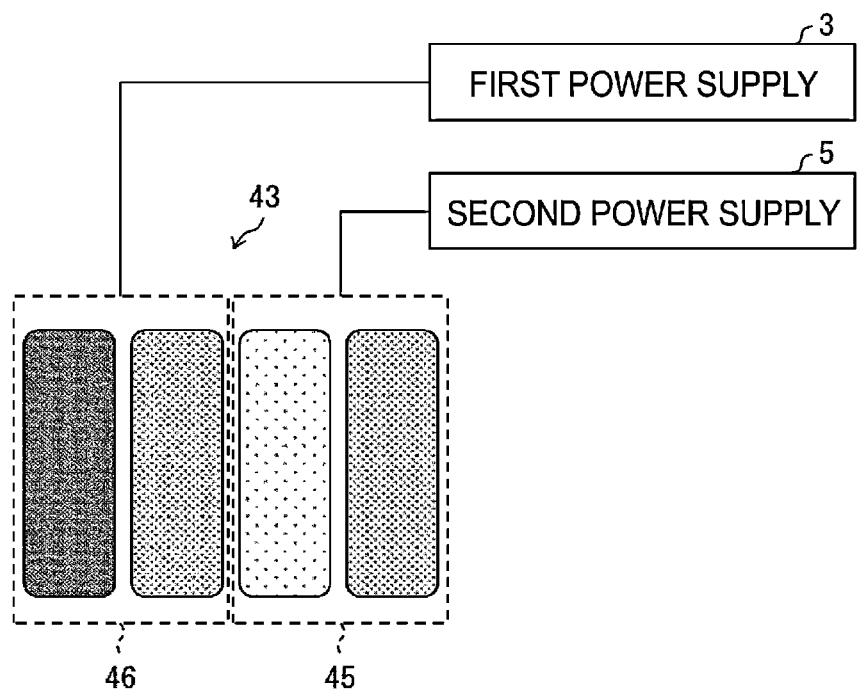
FIG. 11 is a conceptual diagram illustrating a pixel mounted on a substrate of a display panel according to Modification Example 2 of the first embodiment.
Figure 11:
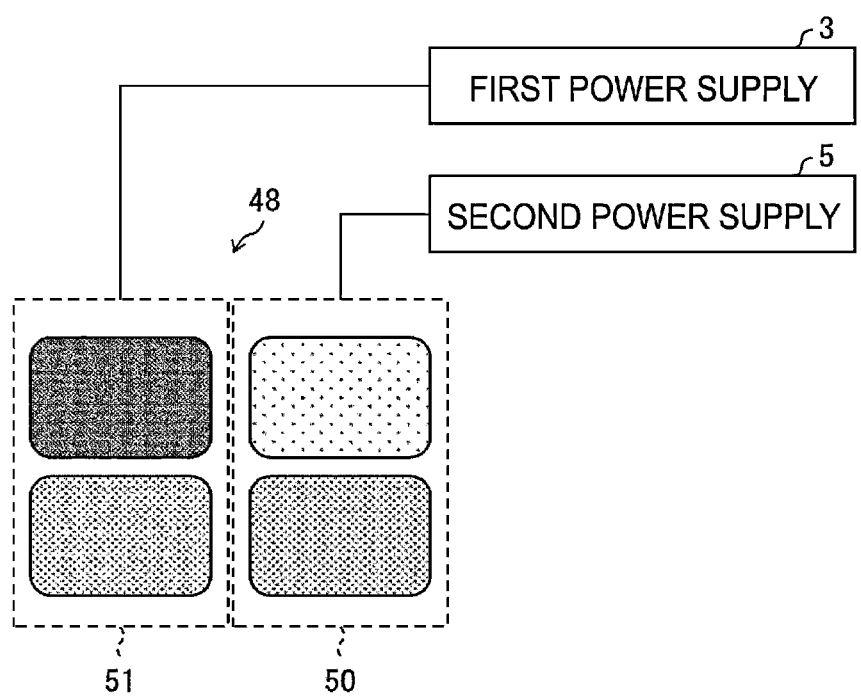

Next, Modification Example 2 of the first embodiment will be described. Subpixels included in a pixel are not necessarily disposed overlapping each other. That is, a first subpixel, a second subpixel, a third subpixel, and a fourth subpixel may be disposed on the same plane of a display panel 10. FIG. 11 is a conceptual diagram illustrating a pixel mounted on a substrate of the display panel 10 according to the present modification example.

A pixel 43 shows a configuration example in which subpixels are disposed side by side. A pixel 48 shows a configuration example in which subpixels are disposed in rows and columns. Here, a region 45 of the pixel 43 and a region 50 of the pixel 48 correspond to the first layer in the pixel 12 in FIG. 2, and a region 46 of the pixel 43 and a region 51 of the pixel 48 correspond to the second layer in the pixel 12. That is, in the configurations of the pixel 43 and the pixel 48, a current is supplied to subpixels of a blue color being a first color from separate power sources. The areas of the subpixels are not limited to being equal to each other and may be different from each other. According to the configuration of the present modification example, it is possible to further curb the influence of excitation light emission due to output light from other subpixels.

Second Embodiment

A second embodiment of the disclosure will be described below. In the present embodiment, control in a case where the first layer and the second layer of the display panel 10 described above differ in characteristics of a light-emitting layer of a first color will be described. Redundant description will not be repeated for matters in common with the above-described embodiment.

When a transmittance of the first layer of the display panel 10 described above is not substantially 100%, a part of output light from the subpixel of the second layer located on the back face side is shielded. Thus, it is desirable to perform adjustment for increasing an output current supplied to the subpixel of the second layer. As one aspect, adjustment or the like for making the thickness or area of the subpixel of the second layer larger than that of the subpixel of the first layer is exemplified.

Figure 12:
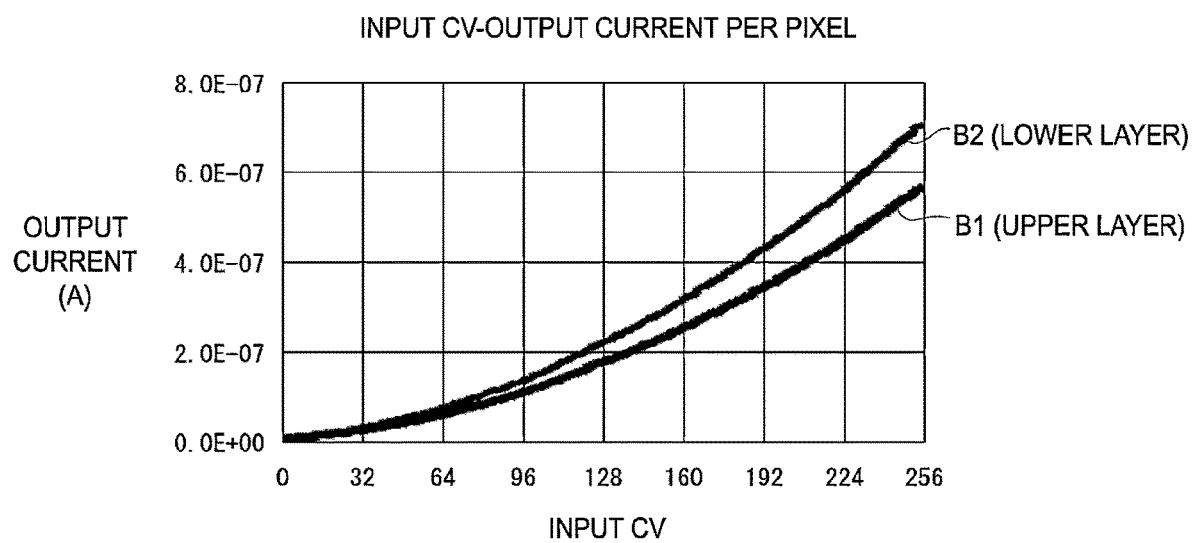
FIG. 12 is a graph showing an example of a relationship between input grayscale values of a B1 pixel and a B2 pixel and output currents corresponding to the input grayscale values in a display panel according to a second embodiment.

FIG. 12 is a graph showing an example of a relationship between input grayscale values of a B1 pixel and a B2 pixel and output currents corresponding to the input grayscale values in the display panel 10 according to the present embodiment. As illustrated in FIG. 12, an output current supplied to the B2 pixel of the second layer is larger than an output current supplied to the B1 pixel of the first layer even at the same input grayscale value. This indicates that a signal processing circuit 7 generates a first signal and a second signal on the assumption that the B2 pixel located on the back face side, out of the B1 pixel and the B2 pixel, has a larger output current with respect to the same input grayscale value.

In the processing corresponding to step S104 described above in the first embodiment, the signal processing circuit 7 according to the present embodiment calculates each of the amounts of currents supplied to the B1 pixels and the B2 pixels using, for example, the following equations. In steps other than step S104, the same processing as that in the first embodiment is executed. In the following equations, $B_{2k}$ represents a current correction coefficient indicating by how many times an output current supplied to the B1 pixel is larger than that supplied to the B2 pixel. Here, the lower the transmittance of the first layer, the larger the value of $B_{2k}$.

$B1_{in}$ is a value equivalent to $B_{in}$ described above and indicates the amount of current supplied to a B pixel in a target pixel when it is assumed that the transmittance of the first layer of the display panel 10 is substantially 100%. $B2_{in}$ represents a corrected value obtained by multiplying $B1_{in}$ by $B_{2k}$. That is, $B2_{in}$ indicates the amount of current supplied to the B pixel in the target pixel when it is assumed that a part of output light is shielded also in the B1 pixel in accordance with the transmittance of the first layer. The signal processing circuit 7 may calculate the values of $B1_{in}$ and $B2_{in}$ with reference to an LUT corresponding to FIG. 12. In other words, the signal processing circuit 7 may generate the first signal and the second signal with reference to an LUT indicating a relationship between an input signal and the amount of current to be supplied to the B1 pixel and an LUT indicating a relationship between an input signal and the amount of current to be supplied to the B2 pixel. Alternatively, the signal processing circuit 7 may calculate the value of $B2_{in}$ by multiplying Blin by a coefficient $B_{2k}$. In contrast, the signal processing circuit 7 may calculate $B1_{in}$ by multiplying $B2_{in}$ by a predetermined coefficient. In other words, the signal processing circuit 7 may generate the first signal with reference to an LUT indicating a relationship between an input signal and the amount of current to be supplied to the B1 pixel, and generate the second signal by using a value obtained by multiplying the current value, which is obtained with reference to the LUT, by a predetermined coefficient.

$B1_{rate}$ indicates a distribution ratio of the amount of current supplied to the B1 pixel with respect to $B1_{in}$, and $B2_{rate}$ indicates a distribution ratio of the amount of current supplied to the B2 pixel with respect to $B2_{in}$.

$$B1_{rate}=(R_{Ave}-G_{Ave})/(1+B_{k2})*B_{Ave}+(B_{2k}/1+B_{2k}))$$
$$(0 \leq B1_{rate} \leq 1)$$

$$B2_{rate}=1-B1_{rate}$$

$$B1_{out}=B1_{in}*B1_{rate}$$

$$B2_{out}=B2_{in}*B2_{rate}$$

For example, when a white color (R, G, B: 255, 255, 255) is displayed in a region of 100% of the screen and the value of $B_{2k}$ is set to 1.25, the amount of current supplied to subpixels is as follows. Here, $G_{out}$ indicates the amount of current supplied to a G pixel in a target pixel, and $R_{out}$ indicates the amount of current supplied to an R pixel in the target pixel. It is assumed that the transmittance of the G pixel is substantially 100%.

$B1_{rate}=(320-300)/(2.25*580)+1.25/2.25=0.571$ $B1_{out}=580*0.571=331$ (nA)

$B2_{out}=580*1.25*(1-0.571)=311$ (nA)

$G_{out}+B1_{out}=300+331=671$ (nA)

$R_{out}=320+311=631$ (nA)

The value of the coefficient $B_{2k}$ does not need to be uniform for all input grayscale values, and may be a different value for each input grayscale. For example, the signal processing circuit 7 may use the value of $B_{2k}$ corresponding to each input grayscale value with reference to an LUT indicating a relationship between an input grayscale value and the value of $B_{2k}$.

According to the configuration of the present embodiment, even when the first layer and the second layer of the display panel 10 differ in the characteristics of the light-emitting layer of the first color, a current supplied to subpixels can be suitably distributed.

Third Embodiment

A third embodiment of the disclosure will be described below. In the present embodiment, control in a case where a signal processing circuit 7 switches a look-up table to be referred to in accordance with the positions of subpixels on a display panel 10 will be described. Redundant description will not be repeated for matters in common with the first or second embodiment.

In the display panel 10, the influence of an IR drop may increase as a pixel is more distant away from a driver serving as a current supply source increases, and an output luminance may decrease. For example, in the case of a configuration in which the driver is disposed at a lower end of the display panel 10, an output luminance of a pixel located at an upper portion of a screen may decrease.

Figure 13:
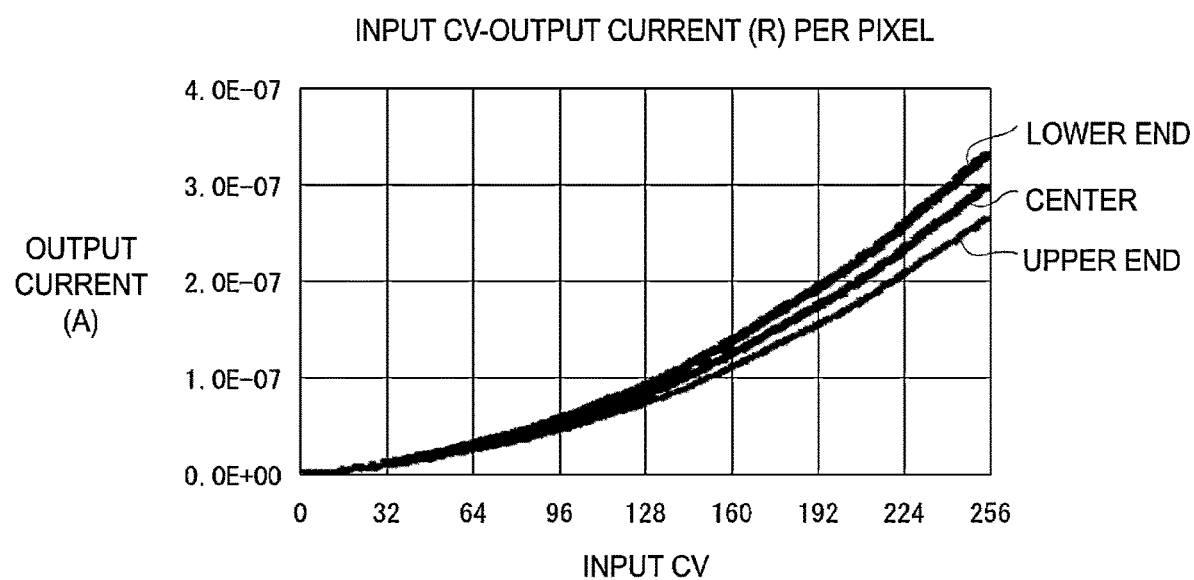
FIG. 13 is a graph showing an example of a relationship between an input grayscale value and an output current that corresponds to the input grayscale value and is supplied to an R pixel at each position on a screen in a display panel according to a third embodiment.

FIG. 13 is a graph showing an example of a relationship between an input grayscale value and an output current that corresponds to the input grayscale value and is supplied to an R pixel at each position on a screen in the display panel 10 according to the present embodiment. FIG. 13 illustrates an example in which a current is less likely to flow in a pixel located at an upper portion of a screen, and an output current is reduced.

In the processing corresponding to step S103 described above in the first embodiment, the signal processing circuit 7 according to the present embodiment calculates the sum of output current values described above for each of the colors of the subpixels, with reference to an LUT in which an output current for an input grayscale value varies depending on the region of the display panel 10. In other words, when the sum of the output current values is calculated, the signal processing circuit 7 uses an output current value corresponding to the position of a target pixel in the display panel 10. Further, the signal processing circuit 7 calculates $R_{Ave}$, $G_{Ave}$, and $B_{Ave}$ by using the output current values.

In the processing corresponding to step S104, the signal processing circuit 7 calculates the amounts of currents supplied to the B1 pixels and the B2 pixels with reference to an LUT in which $B_{in}$, which is the amount of current supplied to a B pixel in a target pixel, varies depending on the region of the display panel 10. In other words, when the amount $B1_{out}$ of current supplied to the B1 pixels and the amount $B2_{out}$ of current supplied to the B2 pixels are calculated, the signal processing circuit 7 uses $B_{in}$ corresponding to the position of a target pixel in the display panel 10. Here, the equations used to calculate $B1_{out}$ and $B2_{out}$ may be the same as those in the first embodiment, as follows.

$B1_{rate}=(R_{Ave}-G_{Ave})/2*B_{Ave}+0.5(0 \leq B1_{rate} \leq 1)$ $B1_{out}=B_{in}*B1_{rate}$ $B2_{out}=B_{in}-B1_{out}$ When a voltage value corresponding to the amount of current is calculated in the processing corresponding to step S105, the signal processing circuit 7 calculates the voltage value by reflecting a current-voltage relationship corresponding to the region of the display panel 10. The signal processing circuit 7 may calculate an input grayscale value corresponding to a current value according to the region of the display panel 10 with reference to, for example, the LUT according to FIG. 13, and then calculate the above-described voltage value with reference to an LUT indicating a relationship between an input grayscale value of each color and a voltage value.

The signal processing circuit 7 is not limited to the configuration in which an LUT to be referred to is switched for each line when the amount of current supplied to a subpixel, or the like, is calculated. For example, when the degree of decrease in an output luminance varies for each rectangular block, the signal processing circuit 7 may be configured to switch an LUT to be referred to for each block.

When the signal processing circuit 7 calculates the amount of current supplied to a subpixel, or the like, the signal processing circuit 7 may calculate the amount of current or the like by using a correction coefficient corresponding to a position on the panel with respect to a current value converted using a reference LUT instead of referring to an LUT varying depending on the region of the display panel 10. For example, the signal processing circuit 7 may calculate the amount of current supplied to a subpixel, or the like, by multiplying the current value converted using the LUT at the center of the screen illustrated in FIG. 13 by a coefficient of 0.85 at the upper end of the screen and by a coefficient of 1.15 at the lower end of the screen as coefficients according to the position on the screen.

Supplement

A display device (1) according to a first aspect of the disclosure is a display device including a display panel (10) including a plurality of pixels (12), the pixels including a first subpixel (14) and a second subpixel (15) each including a light-emitting layer that emits light of a first color, a third subpixel (16) including a light-emitting layer that emits light of a second color, and a fourth subpixel (17) including a light-emitting layer that emits light of a third color, a first power supply (3) that supplies a current to the first subpixel and the third subpixel, a second power supply (5) that supplies a current to the second subpixel and the fourth subpixel, and a signal processing circuit (7) that receives an input signal for each pixel and generates a first signal corresponding to the first subpixel and a second signal corresponding to the second subpixel.

According to the configuration described above, it is possible to curb a decrease in luminance and occurrence of color shift due to an IR drop in the display panel.

According to a second aspect of the disclosure, in the display device according to the first aspect described above, the first subpixel and the third subpixel may be disposed in a planar shape in a first layer of the display panel, the second subpixel and the fourth subpixel may be disposed in a planar shape in a second layer of the display panel, and the first layer and the second layer of the display panel may be disposed overlapping each other when viewed from a front of the display panel.

According to the configuration described above, the area per pixel is reduced, which contributes to an improvement in fineness.

According to a third aspect of the disclosure, in the display device according to the second aspect described above, the first subpixel may be disposed overlapping the second subpixel, and the third subpixel may be disposed overlapping the fourth subpixel.

According to the configuration described above, it is possible to further curb the influence of excitation light emission due to output light from other subpixels.

According to a fourth aspect of the disclosure, in the display device according to the first aspect described above, the first subpixel, the second subpixel, the third subpixel, and the fourth subpixel may be disposed on the same plane in the display panel.

According to the configuration described above, it is possible to further curb the influence of excitation light emission due to output light from other subpixels.

According to a fifth aspect of the disclosure, in the display device according to any one of the first to fourth aspects described above, the signal processing circuit may generate the first signal and the second signal in accordance with an amount of current to be supplied by the first power supply to the third subpixel included in the plurality of pixels and an amount of current to be supplied by the second power supply to the fourth subpixel included in the plurality of pixels.

According to the configuration described above, it is possible to further curb a decrease in luminance and occurrence of color shift due to an IR drop.

According to a sixth aspect of the disclosure, in the display device according to any one of the first to fourth aspects described above, the signal processing circuit may generate the first signal and the second signal in such a manner that an amount of current supplied to the second subpixel included in the plurality of pixels is larger than an amount of current supplied to the first subpixel included in the plurality of pixels when an amount of current to be supplied by the second power supply to the fourth subpixel included in the plurality of pixels is smaller than an amount of current to be supplied by the first power supply to the third subpixel included in the plurality of pixels.

According to the configuration described above, it is possible to further curb a decrease in luminance and occurrence of color shift due to an IR drop.

According to a seventh aspect of the disclosure, in the display device according to the sixth aspect described above, the signal processing circuit may set a grayscale value of the second signal to be equal to or less than a grayscale value of the first signal in the above-described case.

According to the configuration described above, it is possible to suitably adjust the amount of current supplied to the first subpixel and the second subpixel.

According to an eighth aspect of the disclosure, in the display device according to any one of the fifth to seventh aspects described above, the signal processing circuit may refer to a look-up table indicating a relationship between the input signal and an amount of current to be supplied to subpixels of the first color, a relationship between the input signal and an amount of current to be supplied to subpixels of the second color, and a relationship between the input signal and an amount of current to be supplied to subpixels of the third color to calculate a first average value, which is an average of the plurality of pixels, of current values to be supplied to the subpixels of the first color, a second average value, which is an average of the plurality of pixels, of current values to be supplied to the subpixels of the second color, and a third average value, which is an average of the plurality of pixels, of current values to be supplied to the subpixels of the third color, and to generate the first signal and the second signal based on the amount of current to be supplied to the subpixels of the first color and the first to third average values.

According to the configuration described above, it is possible to suitably adjust the amount of current supplied to the first subpixel and the second subpixel.

According to a ninth aspect of the disclosure, in the display device according to the eighth aspect described above, the signal processing circuit may switch a look-up table to be referred to in accordance with a position of each pixel on the display panel.

According to the configuration described above, even when an output luminance changes depending on the position on the display panel, it is possible to curb a decrease in luminance and occurrence of color shift due to an IR drop.

According to a tenth aspect of the disclosure, in the display device according to the eighth aspect described above, the signal processing circuit may generate the first signal and the second signal by multiplying the current values calculated with reference to the look-up table by a correction coefficient corresponding to a position of each pixel on the display panel.

According to the configuration described above, the influence of an IR drop can be corrected with a smaller number of look-up tables, and thus a memory for storing the look-up tables can be saved.

According to an eleventh aspect of the disclosure, in the display device according to the eighth aspect described above, the signal processing circuit may generate the first signal and the second signal for a frame subsequent to a certain frame of the input signal based on the first average value, the second average value, and the third average value relating to the certain frame.

According to the configuration described above, a processing load in the signal processing circuit can be reduced.

According to a twelfth aspect of the disclosure, in the display device according to the eighth aspect described above, the signal processing circuit may limit an amount of change from a distribution ratio in a certain frame of the input signal to a distribution ratio in a frame subsequent to the certain frame to a predetermined amount or less by using a ratio of an amount of current supplied to the first subpixel to the amounts of currents supplied to the subpixels of the first color as a distribution ratio.

According to the configuration described above, it is possible to curb occurrence of fluctuation in an output luminance in the subpixels of the first color.

According to a thirteenth aspect of the disclosure, in the display device according to the second aspect described above, the signal processing circuit may generate the first signal and the second signal on the assumption that a subpixel located on a back face side, out of the first subpixel and the second subpixel, has a larger output current with respect to the same input grayscale value.

According to the configuration described above, even when a part of light emitted from the subpixel located on the back face side is shielded, the signal processing circuit can suitably calculate the amount of current supplied to the first subpixel and the second subpixel.

According to a fourteenth aspect of the disclosure, in the display device according to the thirteenth aspect described above, the signal processing circuit may generate the first signal and the second signal with reference to a look-up table indicating a relationship between the input signal and an amount of current to be supplied to the first subpixel and a look-up table indicating a relationship between the input signal and an amount of current to be supplied to the second subpixel.

According to the configuration described above, even when a part of light emitted from the subpixel located on the back face side is shielded, the signal processing circuit can suitably calculate the amount of current supplied to the first subpixel and the second subpixel.

According to a fifteenth aspect of the disclosure, in the display device according to the thirteenth aspect described above, the signal processing circuit may generate the first signal with reference to a look-up table indicating a relationship between the input signal and an amount of current to be supplied to the first subpixel, and generates the second signal by using a value obtained by multiplying a current value by a predetermined coefficient, the current value being obtained with reference to the look-up table.

According to the configuration described above, even when a part of light emitted from the subpixel located on the back face side is shielded, the influence of an IR drop can be corrected with a smaller number of look-up tables, and thus a memory for storing the look-up tables can be saved.

According to a sixteenth aspect of the disclosure, in the display device according to any one of the first to fourth aspects described above, the signal processing circuit may set the first signal and the second signal to different values.

According to the configuration described above, the signal processing circuit can suitably adjust a ratio of the amount of current supplied to the first subpixel to the amount of current supplied to the second subpixel.

The disclosure is not limited to each of the embodiments described above, and various modifications may be made within the scope of the claims. Embodiments obtained by appropriately combining technical approaches disclosed in each of the different embodiments also fall within the technical scope of the disclosure. Furthermore, novel technical features can be formed by combining the technical approaches disclosed in each of the embodiments.

The invention claimed is:

1. A display device comprising:
   a display panel including a plurality of pixels, the plurality of pixels including:
   a first subpixel and a second subpixel each including a light-emitting layer emitting light of a first color,
   a third subpixel including a light-emitting layer emitting light of a second color, and
   a fourth subpixel including a light-emitting layer emitting light of a third color;
   a first power supply configured to supply a current to the first subpixel and the third subpixel;
   a second power supply configured to supply a current to the second subpixel and the fourth subpixel; and
   a signal processing circuit configured to receive an input signal for each pixel of the plurality of pixels and to generate a first signal corresponding to the first subpixel and a second signal corresponding to the second subpixel,
   wherein the signal processing circuit generates the first signal and the second signal in such a manner that an amount of current supplied to the second subpixel included in the plurality of pixels is smaller than an amount of current supplied to the first subpixel included in the plurality of pixels when an amount of current to be supplied by the second power supply to the fourth subpixel included in the plurality of pixels is larger than an amount of current to be supplied by the first power supply to the third subpixel included in the plurality of pixels, and
   the signal processing circuit generates the first signal and the second signal in such a manner that the amount of current supplied to the second subpixel included in the plurality of pixels is larger than the amount of current supplied to the first subpixel included in the plurality of pixels when the amount of current to be supplied by the second power supply to the fourth subpixel included in the plurality of pixels is smaller than the amount of current to be supplied by the first power supply to the third subpixel included in the plurality of pixels.

2. The display device according to claim 1,
wherein the first subpixel and the third subpixel are disposed in a planar shape in a first layer of the display panel,
the second subpixel and the fourth subpixel are disposed in a planar shape in a second layer of the display panel, and
the first layer and the second layer of the display panel are disposed overlapping each other when viewed from a front of the display panel.

3. The display device according to claim 2,
wherein the first layer and the second layer of the display panel are disposed overlapping each other such that the first subpixel is disposed overlapping the second subpixel, and the third subpixel is disposed overlapping the fourth subpixel.

4. The display device according to claim 2,
wherein the signal processing circuit generates the first signal and the second signal on an assumption that a subpixel located on a back face side, out of the first subpixel and the second subpixel, has a larger output current with respect to the same input grayscale value.

5. The display device according to claim 4,
wherein the signal processing circuit generates the first signal and the second signal with reference to a look-up table indicating a relationship between the input signal and an amount of current to be supplied to the first subpixel and a look-up table indicating a relationship between the input signal and an amount of current to be supplied to the second subpixel.

6. The display device according to claim 4,
wherein the signal processing circuit generates the first signal with reference to a look-up table indicating a relationship between the input signal and an amount of current to be supplied to the first subpixel, and generates the second signal by using a value obtained by multiplying a current value by a predetermined coefficient, the current value being obtained with reference to the look-up table.

7. The display device according to claim 1,
wherein the first subpixel, the second subpixel, the third subpixel, and the fourth subpixel are disposed on the same plane in the display panel.

8. The display device according to claim 1,
wherein the signal processing circuit sets a grayscale value of the second signal to be equal to or less than a grayscale value of the first signal in a case that the signal processing circuit generates the first signal and the second signal in such a manner that the amount of current supplied to the second subpixel included in the plurality of pixels is smaller than the amount of current supplied to the first subpixel included in the plurality of pixels when the amount of current to be supplied by the second power supply to the fourth subpixel included in the plurality of pixels is larger than the amount of current to be supplied by the first power supply to the third subpixel included in the plurality of pixels in the case according to claim 6.

9. The display device according to claim 1,
wherein the signal processing circuit sets the first signal and the second signal to different values.

10. A display device comprising:
a display panel including a plurality of pixels, the plurality of pixels including:
    a first subpixel and a second subpixel each including a light-emitting layer emitting light of a first color,
    a third subpixel including a light-emitting layer emitting light of a second color, and
    a fourth subpixel including a light-emitting layer emitting light of a third color;
a first power supply configured to supply a current to the first subpixel and the third subpixel;
a second power supply configured to supply a current to the second subpixel and the fourth subpixel; and
a signal processing circuit configured to receive an input signal for each pixel of the plurality of pixels and to generate a first signal corresponding to the first subpixel and a second signal corresponding to the second subpixel,
wherein the signal processing circuit refers to a look-up table indicating a relationship between the input signal and an amount of current to be supplied to subpixels of the first color, a relationship between the input signal and an amount of current to be supplied to subpixels of the second color, and a relationship between the input signal and an amount of current to be supplied to subpixels of the third color to calculate a first average value, which is an average of the plurality of pixels, of current values to be supplied to the subpixels of the first color, a second average value, which is an average of the plurality of pixels, of current values to be supplied to the subpixels of the second color, and a third average value, which is an average of the plurality of pixels, of current values to be supplied to the subpixels of the third color, and to generate the first signal and the second signal based on the amount of current to be supplied to the subpixels of the first color and the first to third average values.

11. The display device according to claim 10,
wherein the signal processing circuit switches a look-up table to be referred to in accordance with a position of each pixel on the display panel.

12. The display device according to claim 10,
wherein the signal processing circuit generates the first signal and the second signal by multiplying the current values calculated with reference to the look-up table by a correction coefficient corresponding to a position of each pixel on the display panel.

13. The display device according to claim 10,
wherein the signal processing circuit generates the first signal and the second signal for a frame subsequent to a certain frame of the input signal based on the first average value, the second average value, and the third average value relating to the certain frame.

14. The display device according to claim 10,
wherein the signal processing circuit limits an amount of change from a distribution ratio in a certain frame of the input signal to a distribution ratio in a frame subsequent to the certain frame to a predetermined amount or less by using a ratio of an amount of current supplied to the first subpixel to the amounts of currents supplied to the subpixels of the first color as a distribution ratio.

\* \* \* \* \*